(12) United States Patent
Wang et al.

(10) Patent No.: US 11,347,298 B2
(45) Date of Patent: May 31, 2022

(54) SYSTEM FOR REDUCING POWER CONSUMPTION UPON LOSS OF MAIN POWER IN AN INFORMATION HANDLING SYSTEM

(71) Applicant: DELL PRODUCTS, LP, Round Rock, TX (US)

(72) Inventors: Isaac Qin Wang, Austin, TX (US); Timothy M. Lambert, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 462 days.

(21) Appl. No.: 16/597,390

(22) Filed: Oct. 9, 2019

(65) Prior Publication Data

US 2021/0109588 A1    Apr. 15, 2021

(51) Int. Cl.
*G06F 1/32* (2019.01)
*G06F 1/3287* (2019.01)
*H03K 3/017* (2006.01)
*G05B 19/045* (2006.01)

(52) U.S. Cl.
CPC ......... *G06F 1/3287* (2013.01); *G05B 19/045* (2013.01); *H03K 3/017* (2013.01); *G05B 2219/25268* (2013.01)

(58) Field of Classification Search
CPC ............... G06F 1/3287; G05B 19/045; G05B 2219/25268; H03K 3/017
See application file for complete search history.

(56) References Cited

U.S. PATENT DOCUMENTS

| 10,061,332 B2 | 8/2018 | North et al. | |
| 2010/0023787 A1* | 1/2010 | Ho | G06F 1/3203 713/320 |
| 2010/0164421 A1* | 7/2010 | Dishman | F04D 27/004 318/471 |
| 2014/0119882 A1* | 5/2014 | Chen | F04D 27/004 415/30 |

* cited by examiner

*Primary Examiner* — Stefan Stoynov
(74) *Attorney, Agent, or Firm* — Larson Newman, LLP (57) ABSTRACT

In accordance with one embodiment, a fan controller operates in a standard mode when main power is provided to the power supply unit in which speed of the fan is controlled in response to a primary pulse width modulation (PWM) signal from a power controller. A loss of the main power to the power supply unit may be detected at a logic circuit, which provides a secondary PWM signal to the fan controller in response to the loss of the main power. In certain embodiments, the fan controller is operated in a power loss mode in response to the secondary PWM signal to direct the speed of the fan to a low-power consumption target speed.

20 Claims, 6 Drawing Sheets

SYSTEM FOR REDUCING POWER CONSUMPTION UPON LOSS OF MAIN POWER IN AN INFORMATION HANDLING SYSTEM

FIELD OF THE DISCLOSURE

The present disclosure generally relates to information handling systems, and more particularly relates to a system for reducing fan power consumption upon loss of main power to the information handling system.

BACKGROUND

As the value and use of information continues to increase, individuals and businesses seek additional ways to process and store information. One option available to users is information handling systems (IHS). An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems. An information handling system often includes cooling systems including fans to facilitate removal of heat from system components.

SUMMARY

A fan controller may operate in a standard mode when main power is provided to a power supply unit. The fan controller controls speed of the fan in response to a primary pulsed width modulation (PWM) signal from a power controller. A loss of the main power to the power supply unit may prompt a secondary PWM signal to the fan controller. The fan controller may operate in a power loss mode in response to the secondary PWM signal, and the fan controller may direct the speed of the fan to a low-power consumption target speed in the power loss mode.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

The systems and techniques described herein facilitate reduction of power drained from a power supply system upon a loss of main power to the power supply system. The teachings of the present disclosure describe a unique manner of reducing power consumption of a fan upon loss of the main power to the power supply unit. In one example, a method for reducing power consumption by a fan upon loss of main power to a power supply unit in an information handling system is disclosed. In accordance with one embodiment of the method, a fan controller is operated in a standard mode when main power is provided to the power supply unit. The fan controller is configured to control speed of the fan in response to a primary pulse width modulation (PWM) signal from a power controller. In certain embodiments, a loss of the main power to the power supply unit is detected at a logic circuit, which provides a secondary PWM signal from the logic circuit to the fan controller in response to loss of the main power to the power supply unit. In certain embodiments, the fan controller is operated in a power loss mode in response to the secondary PWM signal, wherein the fan controller directs the speed of the fan to a low-power consumption target speed in the power loss mode.

Certain embodiments of the disclosure are directed to a fan control system for use in an information handling system having a power supply unit configured to receive power from a main power supply. In certain examples, the fan control system includes a fan controller configured to operate in a standard mode when the main power supply provides power to the power supply unit. In the standard mode, the fan controller may be configured to control the speed of a fan in response to a primary PWM signal that is received from a power controller. Certain embodiments of the fan control system also include a programmable logic device that is configured to receive a power status signal corresponding to a state of power from the main power supply to the power supply unit. The programmable logic device may be configured to provide a secondary PWM signal to the fan controller when the power status signal goes to a state indicating that the power supply unit is not receiving power from the main power supply. The fan controller may be configured to operate in a power loss mode in response to the secondary PWM signal to direct the speed of the fan to a low-power consumption target speed in the power loss mode.

Certain embodiments of the disclosure are directed to an information handling system having a processor, NVDIMM memory accessible to the processor, and a power supply system configured to receive main power to generate system power to the NVDIMM, and a fan disposed to provide airflow over the NVDIMM. Certain embodiments include a fan controller configured to control speed of the fan and a primary PWM signal generator configured to generate a primary PWM signal to the fan controller. In certain examples, the fan controller uses the primary PWM signal to operate in a standard mode when main power is provided to the power supply unit. In the standard mode, the fan controller is configured to control speed of the fan in response to the primary PWM signal from the primary PWM signal generator.

In certain embodiments, the power supply system is configured to generate a power loss signal indicative of a loss of main power to the power supply system. A programmable logic device may be configured to receive the power loss signal. In certain embodiments, the programmable logic device is configured to generate a secondary PWM signal to the fan controller when the power loss signal indicates a loss of main power to the power supply system. The fan controller may operate in a power loss mode in response to the secondary PWM signal. In the power loss mode, the fan controller may direct the speed of the fan to a low-power consumption target speed.

Figure 1:
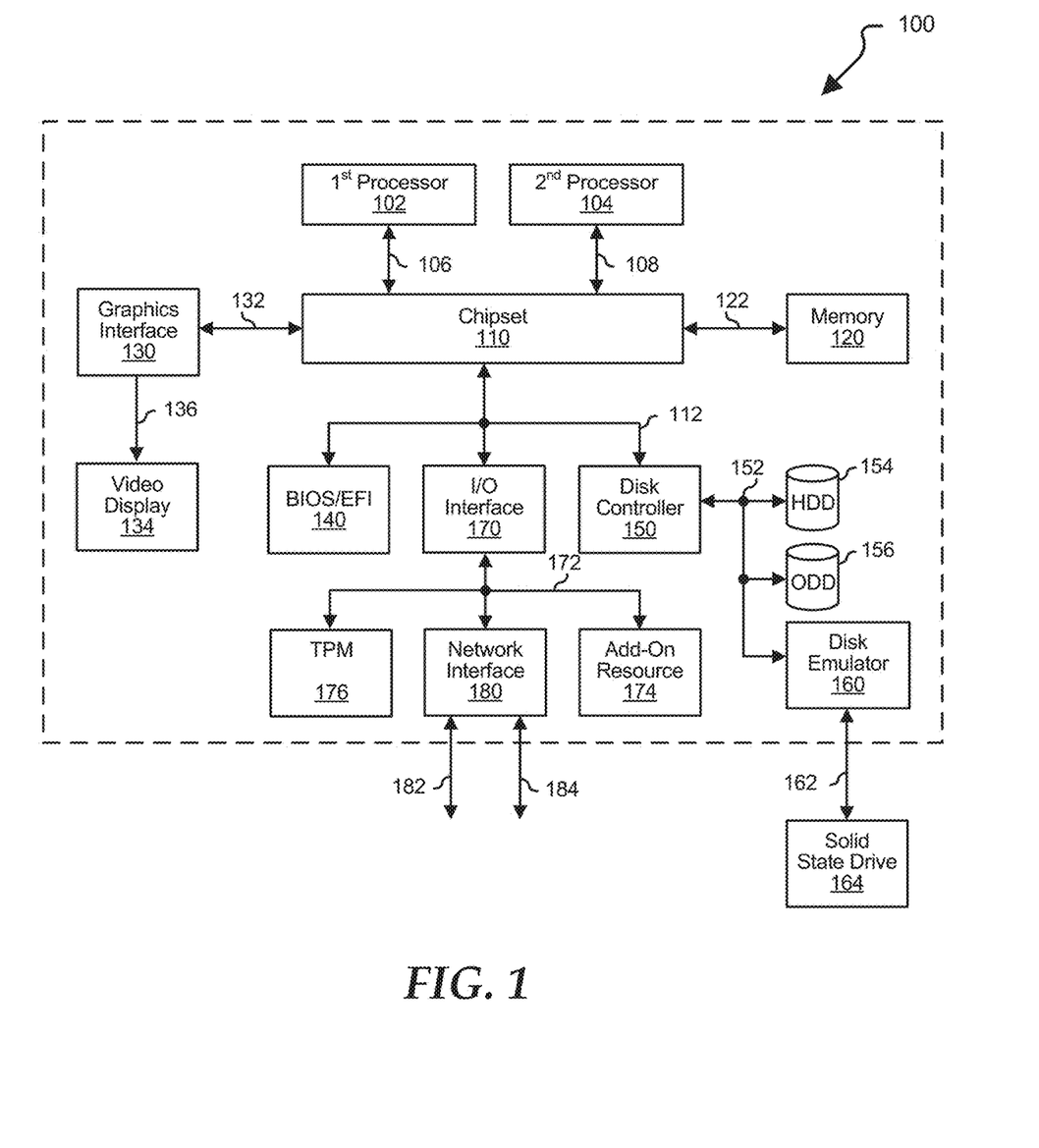
FIG. 1 illustrates a generalized embodiment of an information handling system.

FIG. 1 illustrates a generalized embodiment of an information handling system 100. For purpose of this disclosure, an information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a processor system which may be a System-on-a-Chip (SoC), a personal computer, a laptop computer, a smart phone, a tablet device or other consumer electronic device, storage array, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a SoC, or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes processors 102 and 104, a chipset 110, a memory 120, a graphics interface 130, a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to the chipset via processor interface 108. In certain embodiments, memory 120 may be connected to chipset 110 via a memory bus 122. In certain embodiments, the memory 120 is not connected to chipset but, rather is attached directly to the processor 102 and/or processor 104. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1394 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174, to a TPM 176, and to network interface 180. Peripheral interface 172 can be the same type of interface as I/O channel 112, or can be a different type of interface. As such, I/O interface 170 extends the capacity of I/O channel 112 when peripheral interface 172 and the I/O channel 112 are of the same type, and the I/O interface translates information from a format suitable to the I/O channel to a format suitable to the peripheral interface 172 when they are of a different type.

Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface 180 includes network channels 182 and 184 that provide interfaces to devices that are external to information handling system 100. In a particular embodiment, network channels 182 and 184 are of a different type than peripheral interface 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Figure 2:
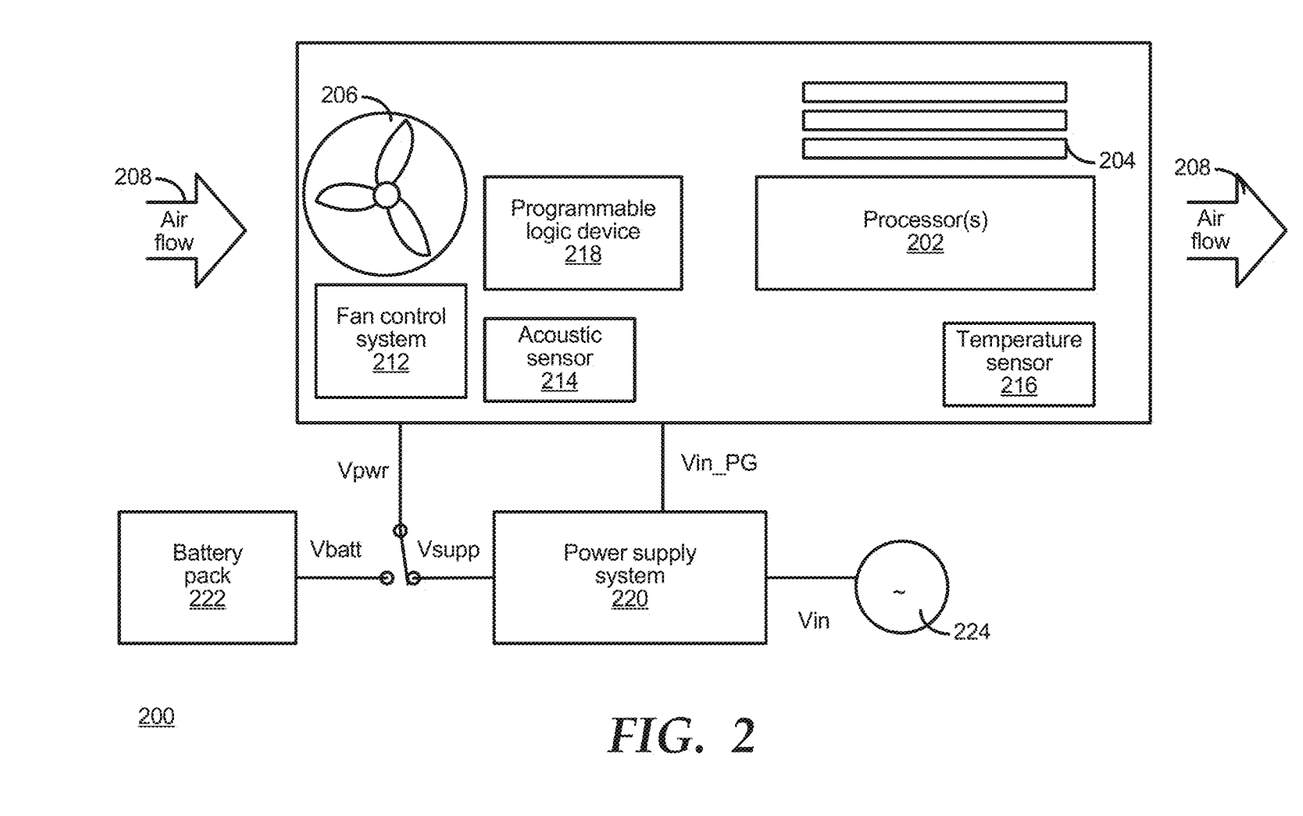
FIG. 2 shows exemplary components of a system that may be employed in certain embodiments of the present disclosure.

FIG. 2 shows exemplary components of a system 200 that may be employed in certain embodiments of the present disclosure. In this example, system 200 may include one or more processors 202 that are configured to access one or more non-volatile dual in-line memory modules 204 (NVDIMM). In certain embodiments, a fan 206 directs a flow of air 208 over the processor 202 and/or NVDIMM 204. In this example, the speed of the fan 206 is controlled by a fan control system 212. In certain embodiments, the fan control system 212 adjusts the speed of the fan 206 in response to an acoustic sensor 214 and/or a temperature sensor 216. In certain examples, the acoustic sensor 214 is configured to monitor the sound that is made by the fan 206, where the fan control system 212 adjusts the speed of the fan 206 based on the sound level generated by the fan 206 in certain environments. In certain examples, the temperature sensor 216 is disposed to provide a signal to the fan control system 212 corresponding to the temperature of one or more components of the system 200. The system 200 may also include a programmable logic device 218 that may operate as part of the fan control system 212 to place the fan control system 212 in a power loss mode as described herein.

The system 200 receives a power input Vpwr, which can be provided by either a power supply system 220 (Vsupp) or battery pack 222 (Vbat). The power supply system 220 receives main power Vin from, for example, a main supply system 224, such as AC power from an AC outlet. In certain embodiments, a power status signal Vin_PG having a state indicative of the condition of the power supply system 220 is provided to the fan control system. In certain embodiments, the power status signal Vin_PG indicates a loss of main power Vin to the power supply system 220. A loss of main power from the main supply system 224 to the power supply system 220 occurs, for example, when the main power supply system 220 fails and/or when the power supply system 220 is removed from system 200 so that the power supply system 220 no longer receives main power. There are also other circumstances under which main power is effectively lost by the power supply system 220. The power status signal Vin_PG may be used to initiate a power loss mode of the fan control system 212 in which the fan control system 212 directs the speed of the fan 206 to a low-power consumption target speed. In certain embodiments, the power loss mode is entered as part of the operations occurring as Vpwr is switched from the output of the power supply system 220 to the output of the battery pack 222 upon the loss of main power Vin.

Vsupp may be received and distributed to the components of system 200 in various manners. In certain embodiments, Vsupp may include multiple voltage outputs that are distributed to various components of the system 200. For example, Vsupp may include different voltage levels (for example 5 VDC, 12 VDC, etc.) used to operate different components (for example processors, fans, etc.). Additionally, or in the alternative, Vsupp may be provided on a single power bus to a power distribution system, which distributes the power at different voltage levels to the various components of the system 200. As such, the present disclosure is not limited to a specific manner of providing and/or distributing Vsupp from either the power supply system 220 or battery pack 222.

Figure 3:
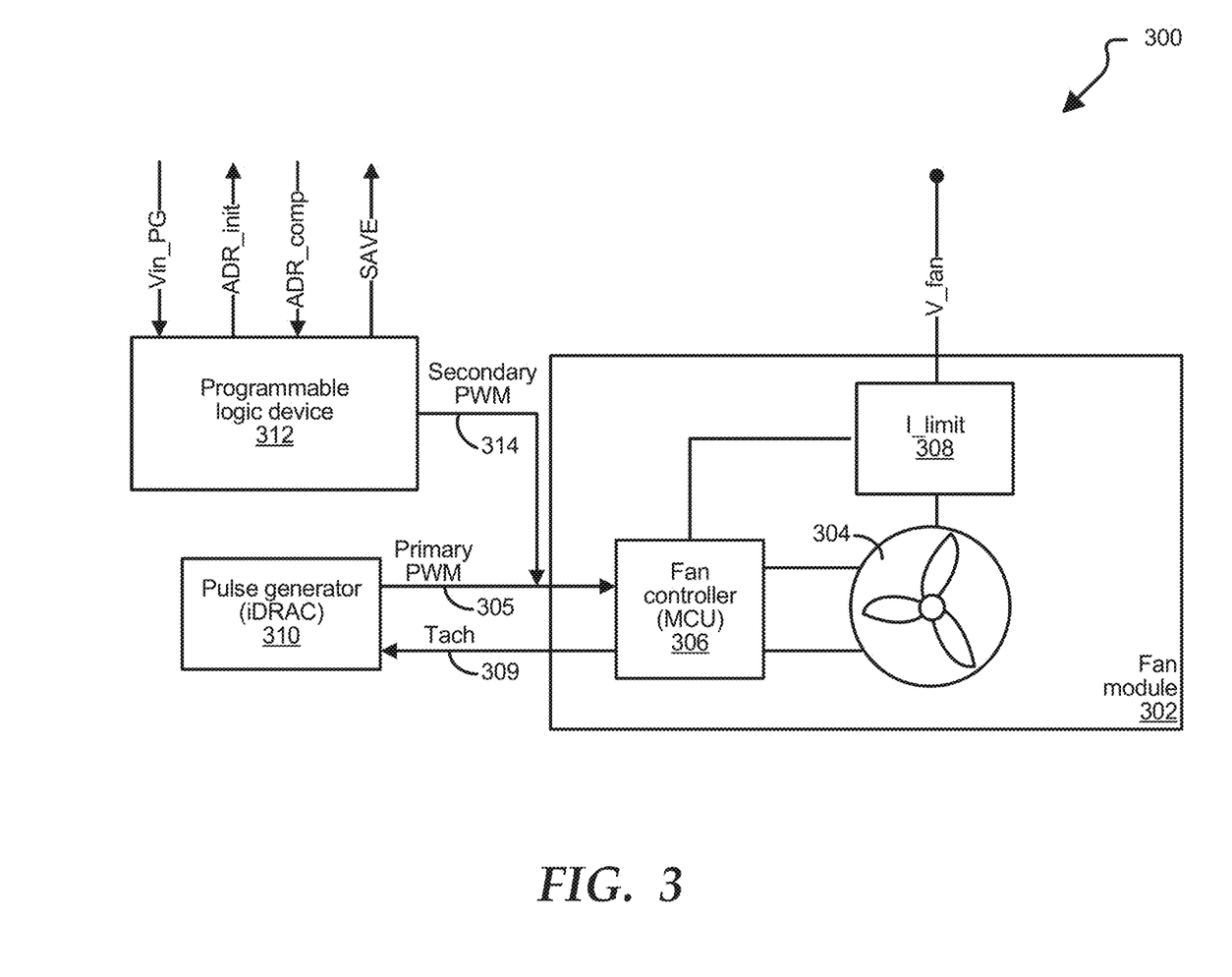
FIG. 3 is a functional block diagram of exemplary components of a fan control system in accordance with certain embodiments of the disclosure.

FIG. 3 shows exemplary components of a fan control system 300 in accordance with certain embodiments of the disclosure. The exemplary fan control system 300 shown in FIG. 3 includes a fan module 302 having a fan 304, a fan controller (for example a microcontroller unit "MCU") 306, and a current limiter 308 through which power V_fan is provided to the fan controller 306 and fan 304. Current limiter 308 operates under the control of fan controller 306 to control the speed of fan 304.

During a standard mode of operation of the fan control system 300, a primary PWM signal 305 is provided to an input of the fan controller 306. In the standard mode, the fan controller 306 controls the speed of the fan 304 based on the duty cycle of the primary PWM signal 305 provided by a power controller 310. In certain embodiments, the duty cycle is dependent on the cooling needs of the information processing system. In certain embodiments, the duty cycle is dependent on the acoustic operation of the fan. Other manners of controlling the duty cycle may also be employed. In the specific example shown in FIG. 3, the power controller 310 may be a part of a baseboard management controller, which operates, among other manners, as an out-of-band power management platform. In certain embodiments, the fan controller 306 may output a tachometer signal 309 indicative of the speed of the fan 304 to the power controller 310 for use in controlling the duty cycle of the primary PWM signal 305. However, it will be recognized that other manners of generating the primary PWM signal 305 may be employed to achieve the desired speed of the fan 304.

In FIG. 3, the fan control system 300 also includes a programmable logic device 312, such as a complex programmable logic device (CPLD). In certain embodiments, the programmable logic device 312 is configured to receive the Vin_PG status signal. So long as the Vin_PG status signal to the programmable logic device 312 indicates that Vin is provided to the power supply system 220, the programmable logic device 312 of this example does not generate a secondary PWM signal 314. However, if Vin is removed, falls below predetermined threshold, and/or becomes intermittent, the Vin_PG status signal to the programmable logic device 312 goes to a state indicating that Vin to the power supply system 220 has been lost. In response to this condition, certain embodiments of the programmable logic device 312 generate a secondary PWM signal 314 to the fan controller 306 directing the fan controller 306 to enter a power loss mode. In the power loss mode, certain embodiments of the fan controller 306 direct the speed of the fan 304 to a low-power consumption target speed. In certain embodiments, the secondary PWM signal 314 overrides the primary PWM signal 305 to place the fan controller 306 in the power loss mode. In certain embodiments, the secondary PWM signal 315 is superimposed on the same input line as the primary PWM signal 305 to the fan controller 306. Use of the same input line may be used to reduce the number of inputs to the fan controller 306 needed to implement certain embodiments of the disclosed system.

Various embodiments of the fan control system 300 may be used to implement certain NVDIMM power down operations. In such embodiments, the programmable logic device 312 may send and/or receive certain signals associated with the NVDIMM power down operations. In the example shown in FIG. 3, the programmable logic device includes an ADR_init output signal that is used to trigger an Asynchronous Dynamic Random Access Memory Refresh (ADR) of the NVDIMM when the Vin_PG status signal indicates a Vin power loss condition. ADR is a feature supported on Intel chipsets that triggers a hardware interrupt to the memory controller of the NVDIMM which will flush write-protected data buffers and place the DRAM in self-refresh. This process takes place during a power loss event or system crash to ensure the data is in a "safe" state when the NVDIMM takes control of the DRAM to backup to Flash. In certain embodiments, the programmable logic device 312 is also configured to receive an ADR_comp signal, which may be used to provide an indication as to when the ADR operation is complete. Upon the detection of ADR completion, certain embodiments of the programmable logic device 312 may provide a SAVE signal, which initiates a save operation in which the NVDIMM takes control of the DRAM and moves the contents of the DRAM to the on-board Flash. When the transfer is complete, the NVDIMM may go into a zero power state in which the data may be retained for the specified duration of the flash, which may be many years.

Figure 4:
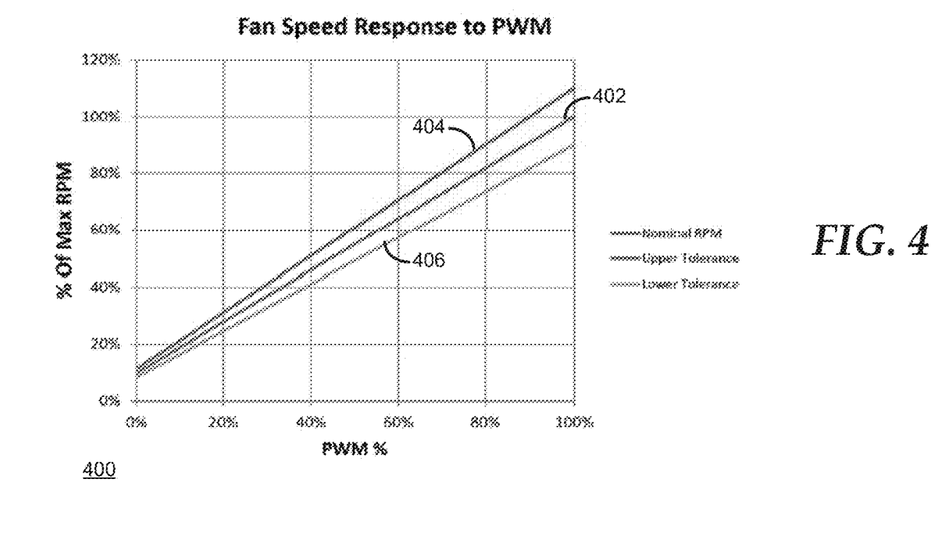
FIG. 4 is a graph depicting an exemplary relationship between the percentage of maximum rpm of the fan speed and the duty cycle of a pulsed width modulation (PWM) signal provided to the fan controller.

FIG. 4 shows a graph 400 depicting an exemplary relationship between the percentage of maximum rpm of the fan speed and the duty cycle of a PWM signal provided to the fan controller. In this example, there is a generally linear relationship between the duty cycle of the PWM signal and the percentage of the maximum rpm of the fan as controlled by the fan controller. In this example, lower PWM duty cycles result in lower fan speeds and, thus, cause the fan to consume less power than higher fan speeds resulting from higher PWM duty cycles. FIG. 4 depicts the nominal rpm at line 402 the upper rpm tolerance at line 404, and lower tolerance at line 406 that may occur in certain implementations of the disclosed system.

Figure 5:
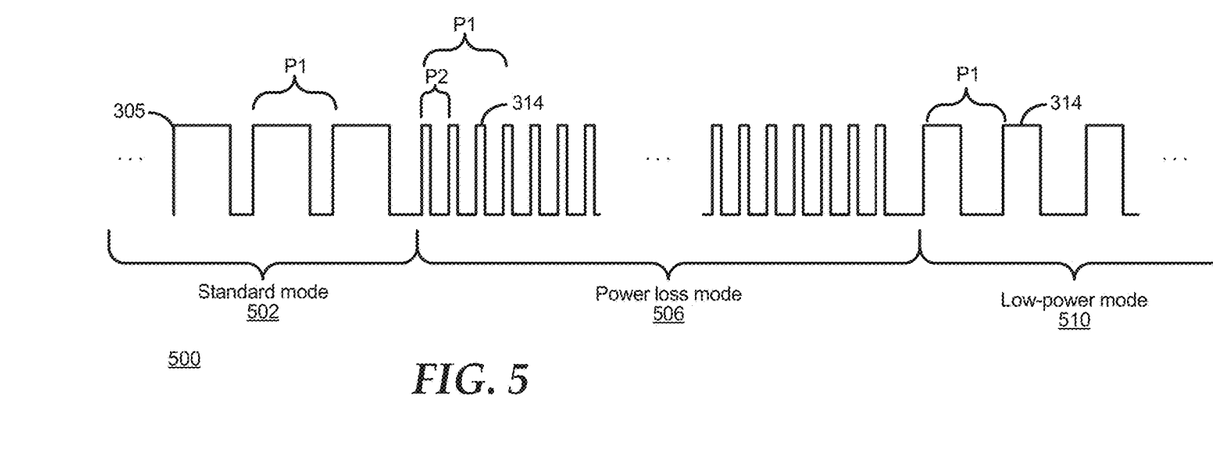
FIG. 5 is a diagram of PWM signals that may be provided to a fan controller during different operational modes of a fan control system in certain embodiments of the disclosed system.

FIG. 5 shows the PWM signals 500 provided to the fan controller 306 during different operational modes of the fan control system 300 in certain embodiments of the disclosed system. In this example, the primary PWM signals 305 are provided to the fan controller 306 during a standard operational mode 502 of the fan control system 300. In the standard operational mode, Vin is supplied to the power supply system, as indicated, for example, by Vin_PG, and the information handling system is executing the general tasks for which the information handling system is designed. In this example, the primary PWM signals 305 are provided at a frequency having a pulse period P1 with a duty cycle based on the standard cooling and/or acoustic needs of the information handling system. Accordingly, the primary PWM signals 305 during the standard operational mode 502 have varying duty cycles for operating the fan 304 at varying speeds in accordance with the standard cooling and/or acoustic needs of the information handling system.

Upon failure of Vin to the power supply, as indicated, for example, by Vin_PG, the fan control system 300 enters the power loss mode 506. In the power loss mode 506 shown in FIG. 5, secondary PWM signals 314, which override the primary PWM pulse signals 305, are generated by the programmable logic device 312 and are provided to the fan controller 306. In certain embodiments, the secondary PWM signals 314 are provided at the same input of the fan controller 306 as the primary PWM signals 305. In certain embodiments, the secondary PWM signals 314 are superimposed on the primary PWM signals 305 and provided to the fan controller 306 at the same input as the primary PWM signals 305. In certain embodiments, the secondary PWM signals 314 generated by the programmable logic device 312 are provided through a resistive circuit in which the secondary PWM signals 314 have a greater weight at the input of the fan controller 306 than the primary PWM signals 305. However, it will be recognized, based on the teachings of the present disclosure, that other manners of overriding the primary PWM signals 305 with the secondary PWM signals 314 may be employed.

In the exemplary embodiment shown in FIG. 5, the secondary PWM signals 314 are provided to the fan controller 306 at a frequency having a pulse period P2. In this example, the pulse period P1 is greater than the pulse period P2 so that the fan controller 306 detects more than two edge transitions of the secondary PWM signals 314 during the pulse period P1. In certain embodiments, fan controller 306 enters the power loss mode 506 when the fan controller 306 detects more than two pulse edge transitions within the pulse period P1. In certain embodiments, the fan controller 306 directs the speed of the fan 304 to a low-power consumption target speed in the power loss mode. In certain embodiments, the fan controller 306 allows the fan to coast to the low-power consumption target speed. In certain embodiments, the duty cycle of the secondary PWM signals 314 may be used by the fan controller 306 to drive the fan 304 to the low-power consumption target speed.

In certain embodiments, the operation of the fan control system 300 during the power loss mode 506 is supported by the residual power present in the power supply system 220 upon a failure of Vin. In certain embodiments, the reduced power consumption of the fan 304 increases the amount of time residual power is available to operate other systems, such as NVDIMMs, of the information handling system. In certain embodiments, power for selected components of the information handling system may be switched from the power supply system 220 to the battery pack 222, at which time the fan control system 300 may enter a low-power mode 510 of operation. During the low-power mode 510, the programmable logic device 312 may cease providing the secondary PWM signals 314 and may again use the primary PWM pulse signals 305 as input to the fan controller 306. In certain embodiments, the primary PWM signals 305 again have a frequency corresponding to pulse period P1. The fan controller 306, no longer detecting more than two pulse edges during the pulse period P1, may determine that the power loss mode is to be exited and is again to use the primary PWM pulse signals 305 to control the speed of the fan 304. In certain embodiments, the duty cycle of the primary PWM signals 305 during the low-power mode 510 is reduced so as not to place an undue power burden on the battery pack 222. In this low-power mode 510, certain embodiments may execute an NVDIMM SAVE operation using power from the battery pack 222 while also receiving the benefit of the airflow provided by the fan to inhibit overheating of the NVDIMMs.

Figure 6:
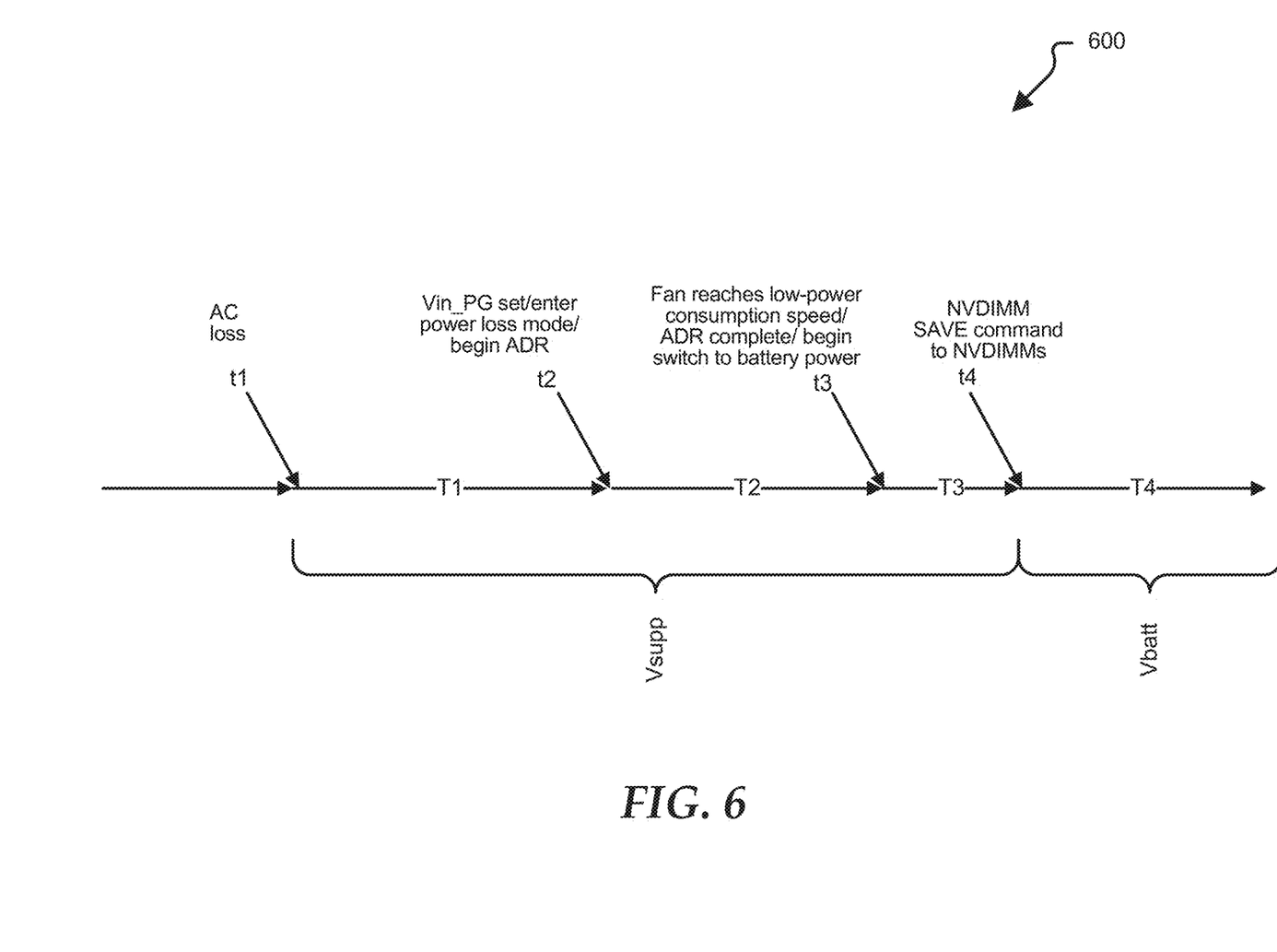
FIG. 6 is an exemplary timeline of operations that may be executed by the fan control system during a power down operation of a non-volatile dual in-line memory module (NVDIMM) in an information handling system.

FIG. 6 shows an exemplary timeline 600 of operations that may be executed by the fan control system 300 during a power down operation of NVDIMMs in an information handling system. In this example, a loss of main power, such as an AC power loss, to the power supply system 220 occurs at time t1. After a time duration T1, the Vin_PG goes to a state at time t2 indicating that main power Vin to the power supply system 220 has been lost. Also at time t2, in response to receipt of the loss status indicated by Vin_PG, the programmable logic device 312 provides secondary PWM signal 314 to the fan controller 306 in a manner so as to override the primary PWM signal 305 thereby causing the fan controller 306 to enter the power loss mode driving the fan 304 to a low-power consumption target speed. In certain embodiments, the programmable logic device 312 may also generate an ADR_init signal to the NVDIMMs, which directs the NVDIMMs to execute an ADR operation.

During time period T2, the fan 304 is driven to its low power consumption target speed by the fan controller 306 by limiting the current provided to the fan 304 through the current limiter 308 to a target current limit I_limit. Also, during timer period T2, the NVDIMMs execute the ADR, completing, or substantially completing, such operations by time t3. At time t3, certain embodiments begin switching Vpwr from Vsupp of the power supply system 220, to Vbatt of the battery pack 222. Such switching takes place during time duration T3. During time periods T1, T2, and T3, the fan control system 300 and NVDIMMs are powered by the residual power of the power supply system 220. By time t4, the fan control system 300 and NVDIMMs are supported by the power Vbatt from the battery pack 222 and the programmable logic device 312 issues a SAVE command to the NVDIMMs, which is executed using Vbatt over time period T4. In certain embodiments, the fan control system 300 may exit the power loss mode at time t4 at which point the fan controller 306 again responds to the primary PWM signals 305 in a low-power mode in which the fan 304 operates at a speed that does not place an undue power drain on the battery pack 222. For example, in the low-power mode, the speed of the fan may be reduced to a level at which power is still available for operations of other components, such as the NVDIMM, while still obtaining the benefit of the cooling airflow provided by the fan.

Exemplary embodiments may operate in accordance with the following approximated target values: T1=6 ms; T2=3 ms; T3=1 ms; low-power target fan speed power consumption=0.5 A. It will be recognized that these parameters are merely exemplary and are not meant to restrict the scope of the present disclosure.

Figure 7:
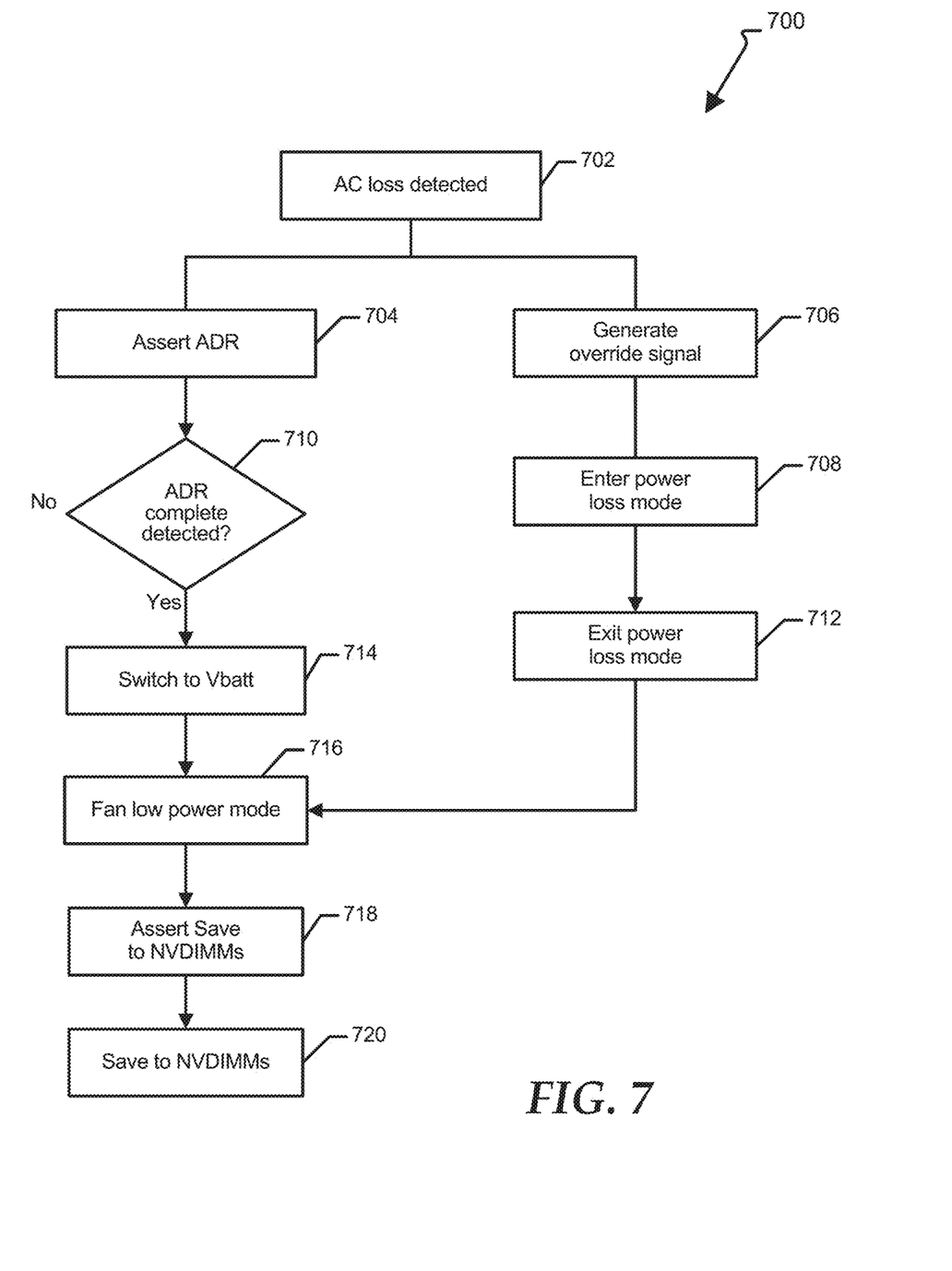
FIG. 7 is a flowchart of exemplary operations that may be executed in an information handling system in accordance with the disclosed teachings.

FIG. 7 shows a flowchart 700 of exemplary operations that may be executed in an information handling system in accordance with the disclosed teachings. In this example, AC power loss to the power supply is detected at operation 702. In response to the detected loss, an ADR signal is provided at operation 704 to an NVDIMM to begin execution of an ADR. Further, in response to the detected loss, the fan controller is directed to enter a power loss mode at operation 708 by providing a PWM override signal. In the power loss mode, the speed of the fan is reduced to a low-power consumption target speed. At operation 710, a determination is made as to whether the CPU integrated memory controller (IMC) has completed execution of the ADR. When the ADR completion is detected at operation 710, a switch to Vbatt of the battery pack takes place at operation 712 and the fan controller exits the power loss mode at operation 712. While power is provided by the battery pack, the fan control system may operate the fan in a low-power control mode in which the speed of the fan is reduced to a further low-power consumption level at which power is still available for operations of other components while the power consumed by the fan not placing an undue train on the battery pack. In certain embodiments, the fan control system enters a low-power mode at operation 716. A SAVE command is asserted to the NVDIMM at operation 718 and executed at operation 720.

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (for example, fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (for example, CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one embodiment," "this embodiment," "these embodiments," "certain embodiments," "this example," means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method for reducing power consumption by a fan upon loss of main power to a power supply unit in an information handling system, comprising:
    operating a fan controller in a standard mode when main power is provided to the power supply unit, wherein the fan controller is configured to control speed of the fan in response to a primary pulse width modulation (PWM) signal from a power controller;

detecting a loss of the main power to the power supply unit at a logic circuit;

providing a secondary PWM signal from the logic circuit to the fan controller in response to loss of the main power to the power supply unit; and operating the fan controller in a power loss mode in response to the secondary PWM signal, wherein the fan controller directs the speed of the fan to a low-power consumption target speed in the power loss mode.

2. The method of claim 1, wherein the secondary PWM signal overrides the primary PWM signal provided to the fan controller to place the fan controller in the power loss mode.

3. The method of claim 2, wherein the secondary PWM signal is superimposed on the primary PWM signal to the fan controller.

4. The method of claim 2, wherein the secondary PWM signal has a duty cycle corresponding to the speed of the fan at the low-power consumption target speed.

5. The method of claim 2, wherein:
the primary PWM signal has a first pulse period and the secondary PWM signal has a second pulse period, wherein the first pulse period is greater than the second pulse period; and
the fan controller enters the power loss mode when the fan controller detects more than two edges during the first pulse period.

6. The method of claim 1, wherein the fan controller allows the fan to coast to the low-power consumption target speed in the power loss mode.

7. The method of claim 1, wherein:
the information handling system includes a non-volatile dual in-line memory module (NVDIMM), wherein the NVDIMM and fan are configured to receive power from either the power supply unit or a battery pack;
the fan controller operates in the power loss mode during an Asynchronous Dynamic Random Access Memory Refresh (ADR) of the NVDIMM;
the speed of the fan reaches the low-power consumption target speed at a time proximate a beginning of a SAVE command to the NVDIMM, wherein the NVDIMM and fan receive power from the battery pack at the beginning of the SAVE command; and
the fan controller operates in a further power loss mode in which the fan and NVDIMM use battery pack power during execution of the SAVE command by the NVDIMM.

8. A fan control system for use in an information handling system having a power supply unit configured to receive power from a main power supply, the fan control system comprising:
a fan controller configured to operate in a standard mode when the main power supply provides power to the power supply unit, wherein the fan controller is configured to control speed of a fan in response to a primary pulse width modulation (PWM) signal from a power controller in the standard mode; and
a programmable logic device configured to receive a power status signal corresponding to a state of power from the main power supply to the power supply unit, wherein the programmable logic device is configured to provide a secondary PWM signal to the fan controller when the power status signal goes to a state indicating that the power supply unit is not receiving power from the main power supply;
wherein the fan controller is further configured to operate in a power loss mode in response to the secondary PWM signal, wherein the fan controller directs the speed of the fan to a low-power consumption target speed in the power loss mode.

9. The fan control system of claim 8 wherein the secondary PWM signal overrides the primary PWM signal provided to the fan controller.

10. The fan control system of claim 9 wherein the secondary PWM signal is superimposed on the primary PWM signal to the fan controller.

11. The fan control system of claim 9 wherein the secondary PWM signal has a duty cycle corresponding to the speed of the fan at the low-power consumption target speed.

12. The fan control system of claim 9 wherein:
the primary PWM signal has a first pulse period, and the second PWM signal has a second pulse period, wherein the first pulse period is greater than the second pulse period; and
the fan controller enters the power loss mode when the fan controller detects more than two edges of a pulse signal during the first pulse period.

13. The fan control system of claim 8 wherein the fan controller allows the fan to coast to the low-power consumption target speed in the power loss mode.

14. The fan control system of claim 8 wherein:
the information handling system includes a non-volatile dual in-line memory module (NVDIMM), wherein the NVDIMM and fan are configured to receive power from either the power supply unit or a battery pack;
the fan controller operates in the power loss mode during an Asynchronous Dynamic Random Access Memory Refresh (ADR) of the NVDIMM;
the speed of the fan reaches the low-power consumption target speed at a time proximate a beginning of a SAVE command to the NVDIMM, wherein the NVDIMM and fan receive power from the battery pack at the beginning of the SAVE command; and
the fan controller operates in a further power loss mode in which the fan and NVDIMM use battery pack power during execution of the SAVE command by the NVDIMM.

15. An information handling system comprising:
a processor;
memory accessible to the processor, wherein the memory includes a non-volatile dual in-line memory module (NVDIMM);
a power supply system configured to receive main power and to generate system power to the NVDIMM, wherein the power supply system is further configured to generate a power loss signal indicative of a loss of main power to the power supply system;
a fan disposed to provide an airflow over the NVDIMM;
a fan controller configured to control speed of the fan;
a primary pulse width modulation (PWM) signal generator configured to generate a primary PWM signal to the fan controller, wherein the fan controller uses the primary PWM signal to operate in a standard mode when main power is provided to the power supply system, wherein the fan controller is configured to control speed of the fan in response to the primary PWM signal from the primary PWM signal generator; and
a programmable logic device configured to receive the power loss signal, wherein the programmable logic device is configured to generate a secondary PWM signal to the fan controller when the power loss signal indicates a loss of main power to the power supply system;

wherein the fan controller operates in a power loss mode in response to the secondary PWM signal, wherein the fan controller directs the speed of the fan to a low-power consumption target speed in the power loss mode.

16. The information handling system of claim 15, wherein the secondary PWM signal overrides the primary PWM signal provided to the fan to place the fan controller in the power loss mode.

17. The information handling system of claim 16, wherein the secondary PWM signal is superimposed on the primary PWM signal to the fan controller.

18. The information handling system of claim 16, wherein:
- the secondary PWM signal has a duty cycle corresponding to the speed of the fan at the low power consumption target speed; and
- the fan controller allows the fan to coast to the lower-power consumption target speed in the power loss mode.

19. The information handling system of claim 16, wherein:
- the primary PWM signal has a first pulse period, and the second PWM signal has a second pulse period, wherein the first pulse period is greater than the second pulse period; and
- the fan controller enters the power loss mode when the fan controller detects more than two edges of a pulse signal during the first pulse period.

20. The information handling system of claim 15, wherein:
- wherein the NVDIMM and fan are configured to receive power from either the power supply system or a battery pack;
- the fan controller operates in the power loss mode during an Asynchronous Dynamic Random Access Memory Refresh (ADR) of the NVDIMM
- the speed of the fan reaches the low-power consumption target speed at a time proximate a beginning of a SAVE command to the NVDIMM, wherein the NVDIMM and fan receive power from the battery pack at the beginning of the SAVE command;
- the fan controller operates in a further power loss mode in which the fan and NVDIMM use battery pack power during execution of the SAVE command by the NVDIMM.

* * * * *